(12) United States Patent
Busse

(10) Patent No.: US 8,159,604 B2
(45) Date of Patent: Apr. 17, 2012

(54) IMAGE SENSING DEVICE OF A CAMERA

(75) Inventor: Erik Busse, Altenburg (DE)

(73) Assignee: Silicon Micro Sensors GmbH, Dresden (DE)

( * ) Notice: Subject to any disclaimer, the term of this patent is extended or adjusted under 35 U.S.C. 154(b) by 504 days.

(21) Appl. No.: 12/389,414

(22) Filed: Feb. 20, 2009

(65) Prior Publication Data

US 2009/0244336 A1 Oct. 1, 2009

(30) Foreign Application Priority Data

Feb. 22, 2008 (DE) .................. 10 2008 010 587

(51) Int. Cl.
*H04N 5/225* (2006.01)

(52) U.S. Cl. .................. 348/374; 250/239; 257/433

(58) Field of Classification Search .................. 348/374; 257/433, 434; 250/239
See application file for complete search history.

(56) References Cited

U.S. PATENT DOCUMENTS 7,326,902 B2 * 2/2008 Nishikawa et al. ........ 250/208.1
7,821,564 B2 * 10/2010 Avron et al. .................. 348/340

* cited by examiner

*Primary Examiner* — Huy K Mai

(74) *Attorney, Agent, or Firm* — Heslin Rothenberg Farley & Mesiti P.C.

(57) ABSTRACT

An image acquisition device of a camera that has an electronic sensor chip, electrically connected to a circuit board, includes an objective situated in an objective carrier, and oriented in regard to situation and inclination in relation to an imager surface of the sensor chip. The situation and inclination of the objective are defined by a contact surface of the objective carrier. The contact surface of the objective carrier lies flat on the sensor chip, so that the imager surface is not covered by the contact surface.

9 Claims, 2 Drawing Sheets

IMAGE SENSING DEVICE OF A CAMERA

CROSS REFERENCE TO RELATED APPLICATIONS

This application claims priority of German application No. 10 2008 010 587.2, filed on Feb. 22, 2008, the entire disclosure of this application being hereby incorporated herein by reference.

BACKGROUND ART

The invention relates to a device of a camera for image acquisition. The device comprises a sensor chip which has an optically active surface, referred to hereafter as the imager surface, and which is situated on a carrier either directly or indirectly by interposing a circuit board. The sensor chip has contact pads, via which the sensor chip is electrically connected to the circuit board. An objective for imaging the environment on the sensor chip is assigned to the sensor chip, the objective being retained in an objective carrier and being oriented in its situation and inclination in relation to the imager surface.

Cameras of this type are employed for various applications in order to optically capture the environment, process and analyze it, and employ the data thus obtained to control devices or methods, for example, or also to control the camera itself.

The construction of such a camera typically comprises at least one electronic sensor chip, to which an objective, which is adapted to the particular application and also the resolution of the sensor and the size of the imager surface, is assigned. The sensor chip is mounted on a circuit board on which signal lines, supply lines, and possibly at least signal preprocessing units are situated.

The circuit board, including the described superstructures, is mounted on a carrier. The objective is situated above each sensor chip at the spacing required in accordance with the optical system of the objective. It is installed on carrier and circuit board in such a way that the sensor chip is completely enveloped and light is only incident on the sensor chip through the lenses. The objective has a separate housing for this purpose if needed.

The carrier and also its connections to the circuit board and to the objective or its housing must fulfill different mechanical, thermal, chemical, and electrical requirements for the various applications, the mechanical stability particularly being ensured for use in mobile devices. The carriers are usually manufactured from metal for this reason. The camera is connected to external devices, which may be used for, e.g., the movement of the camera via the carrier so that a plane of the carrier is defined as a reference surface, to which the sensor chip and the objective are oriented, for the orientation of the camera in relation to these external devices.

An exact orientation of sensor chip and objective to one another is an essential condition for an analyzable image quality. This orientation comprises the lateral orientation of both components on the one hand, via which in particular the image quality in the boundary area of the imager surface and thus the dimension of the imager surface providing analyzable results are determined. The orientation also comprises the inclination of both components to one another, which may be established via the inclination of each individual component to the same reference surface. The inclination of the imager surface alone to the reference surface also has an influence on the recorded image and its analysis, because a movement or positioning of the camera and thus the imager surface occurs in relation to the reference surface, as described above.

If the imager surface and reference surface are tilted to one another, the recorded image is a function of a rotation of the camera around its optical axis. This effect is known as "tilt" or "yaw, pitch, and roll," and may only be avoided by an exact and very complex parallel orientation of the imager surface to the reference surface. This orientation is accordingly also to be produced in the same precision for the inclination of the objective to the reference surface and is particularly to be maintained independently of thermal and mechanical strains during the entire service life of the camera. This often proves to be difficult because of the differing spatial expansions of the sensor chip and objective carrier.

Furthermore, losses in image quality may arise due to a shift of the sensor chip and the objective in relation to one another, for example. On the other hand, the impairments are also possible due to scattered light, which is incident on the sensor chip through defective connections between the carrier and the objective. The connections between carrier and objective are usually adhesive bonds, which may crack open as a result of the thermal expansions of carrier and objective.

BRIEF SUMMARY OF INVENTION

The invention is thus based on the object of specifying a camera, which ensures chronologically stable optics, and in particular a chronologically stable orientation between objective and sensor chip, even in the event of thermal and mechanical strain.

The situation and the inclination of the objective in relation to the imager surface are defined by their direct connection to one another using the image acquisition device described below, and are thus decoupled from the situation and the thermal or mechanical behavior of any connection elements between both components. The situation of the object to the situation of the sensor chip and thus also of the imager surface is uniquely identified via the definition of a contact surface on the objective carrier, at which the situation of the objective is defined, and the direct planar contact to the top side of the chip which has the imager surface. The uniqueness of the situation relates to both the lateral orientation and also the inclination, which both have an influence on the quality and stability of the image recording, as described above. Shifts or inclinations by any connection elements between objective carrier and imager surface, such as adhesives, for example, are avoided both during assembly and also in operation using the described image acquisition device.

In addition, via the defined situation of the sensor chip to a reference surface of the image acquisition device, there is also a defined situation of the objective to this reference surface. Such a reference surface may be selected arbitrarily as a function of the further construction of the camera and its installation in an external device. For example, it may be the installation surface of a carrier on which the sensor chip is installed directly or indirectly interposed with a circuit board. In order to also reduce the influence of connection elements on the situation of the contact surface in relation to the reference surface here, a surface of the circuit board may also be used as the reference surface. If the relative situation of the contact surface to any other surface of the camera may be defined as thermally and mechanically stable by suitable aids, for example, such a surface of the camera is also suitable as the reference surface.

It is also possible via the design of an objective carrier to integrate elements in the objective carrier which allow an installation, which is possibly also automated, of the objective in the correct position and having the correct spacing to the sensor chip and to permanently ensure this position. Such elements are, for example, spacers which set a defined spacing between the objective carrier and the carrier, so that the optical system of the objective is set precisely on the sensor chip and its spacing is uniform over the entire sensor surface. Guide elements are also to be integrated in this way, which may have a correspondence in the carrier, so that the lateral position of the objective to the sensor chip is defined.

BRIEF DESCRIPTION OF THE DRAWING FIGURES

The invention is to be explained in greater detail hereafter on the basis of an exemplary embodiment. In the associated figures.

DETAILED DESCRIPTION

Figure 1:
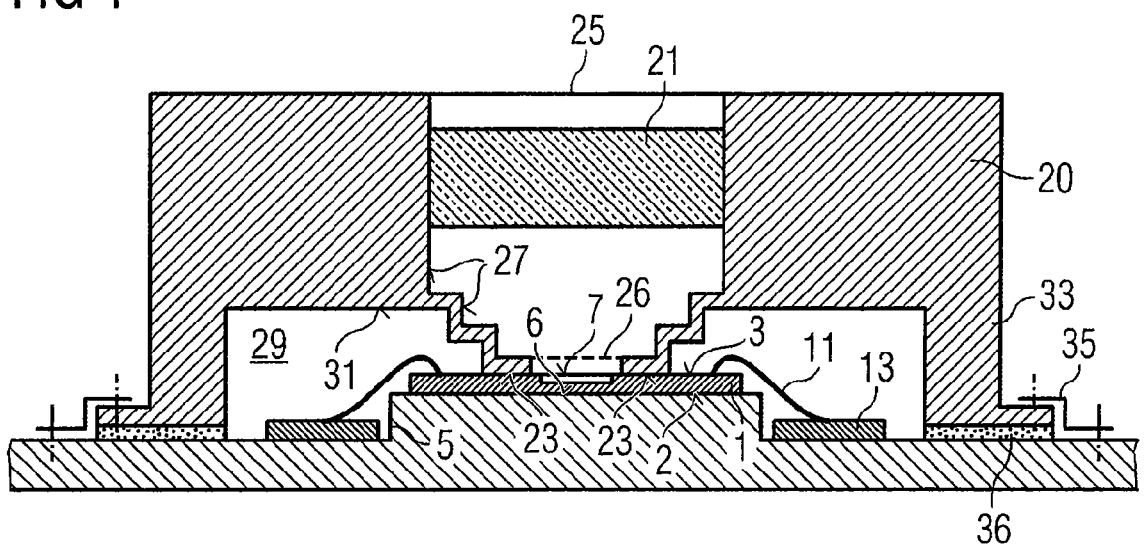
FIG. 1 shows an embodiment of an image-recording device, which is installed directly on a carrier, in a sectional illustration.

The image-recording device according to FIG. 1 comprises a plate-like carrier 4, which is made of stainless steel in the present exemplary embodiment. The carrier 4 has a pedestal 5, on which the bottom side 2 of an electronic sensor chip 1 rests. The contact surface of the pedestal 5 is somewhat larger than the sensor chip 1.

In its top side 3, the sensor chip 1 comprises an optically active surface, the imager surface 7, which is situated centrally and having spacing to the outer edges of the sensor chip 1. The sensor chip 1 has rows of contact pads 9 on its outer edges, using which the sensor chip 1 is electrically connected using flexible connectors 11, wire bridges in the exemplary embodiment, to a circuit board 13.

Figure 2:
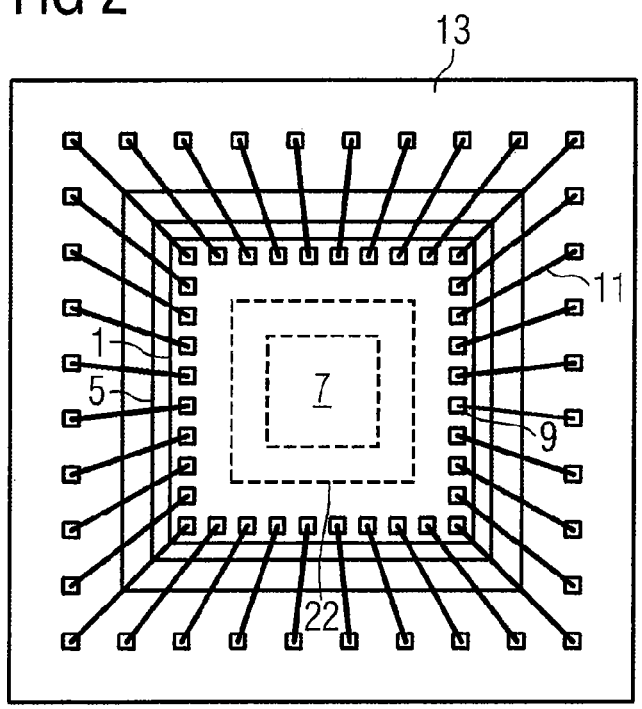
FIG. 2 shows a top view of the sensor chip according to FIG. 1.

The circuit board 13 encloses the pedestal 5 around its entire circumference, in that the circuit board 13 has an opening, which is adapted in size and form to the pedestal 5 and maintains a slight spacing to the pedestal on all sides (FIG. 2).

The voltage supply of the one image acquisition device or further image acquisition devices (not shown) of the camera, as well as the control and signal processing, or at least the preprocessing of the signals received from the sensor chip(s) 1, to be relayed to an analysis unit, are implemented via the circuit board. The sensor chip 1 is electrically connected to the circuit board 13 for this purpose. Notwithstanding the electrical connection in the exemplary embodiment according to FIG. 1 and FIG. 2, other known connection technologies may also come into consideration, depending on the construction and functionality of the sensor chip 1.

According to the object to be implemented, the circuit board 13 has an electronic circuit (not shown in greater detail), for example, having integrated circuits, active and passive switching elements, and the bars and printed conductors (not shown in greater detail) necessary for this purpose, for the signal conduction to and from the one or more sensor chip(s) 1 and for voltage supply of the sensor chip(s) 1. An electronic circuit also comprises the control of more than one image acquisition device for synchronous recording of the images, inter alia, for example.

FIG. 2, which shows in a top view the sensor chip 1, the pedestal 5, and a section of the circuit board 13, also permits the configuration of contact pads 9 and flexible connectors 11 in relation to the image surface 7 to be inferred. Their size ratio and situation to one another is implemented in such a way that one surface remains free between the two (shown by dashed lines), which encloses the imager surface 7 and on which the contact surface 23 of an objective carrier 20 may be positioned.

The surface is to be referred to hereafter as the contact area 22, it being obvious that the situation, design, and size of the contact area 22 may deviate from the situation, design, and size shown. These are a function, inter alia, of the size of the required contact surface 23 and the size of the imager surface 7. The situation and number of the contact pads 9 also has an influence, other contacting possibilities also being able to be implemented between the sensor chip 1 and circuit board 13 in other embodiments, in which no contact pads 9 are situated on the top side 3. For example, the sensor chip 1 may be housed and have differently formed contacts on its lateral enclosure surface or its bottom side 2.

The design of the contact area 22 in no way defines the design of the contact surface 23, but rather only the area on the top side 3 of the sensor chip 1 in which the contact surface 23 of the objective carrier 20 may be laid. The contact surface 23 itself may enclose the imager surface 7 around its entire circumference as shown in FIG. 2, but may also be composed of multiple partial surfaces, which are spaced apart from one another. This is the case, for example, when the objective carrier 20 is positioned using separate bases on the sensor chip 1. While in the event of a contact of the objective carrier 20 around the entire circumference of the imager surface 7, losses of the incident light and unintentional reflections may be avoided in the environment of the imager surface 7, suitable measures may be taken to avoid such effects in the event of positioning using individual bases, for example.

An objective 21 is situated above the sensor chip 1 and spaced apart therefrom using the objective carrier 20 (FIG. 1). The objective carrier 20 of the image acquisition device holds, protects, and positions an objective 21. An optical system, which comprises various optical elements such as lenses or mirrors or other optical elements to image the objects and images an object on the imager surface 7 of the sensor chip 1, is to be referred to as the objective 21. In FIG. 1 and also in FIG. 3, however, the objective 21 is only shown schematically for a better overview. Standard embodiments of objectives 21 can also be used for the described image acquisition device.

The focus of the objective 21 may be settable in various embodiments in the installed state, so that the sharp imaging of objects at specific distances is only set after the installation of the objective 21 in accordance with the spacing then existing between the objective 21 and sensor chip 1. A fixed focus system, in which the focus is set permanently, is also applicable because of the positioning of the objective carrier 20 on the sensor chip 1 and the distance between the two thus defined.

According to FIG. 1, one embodiment of the objective carrier 20 comprises a so-called light trap between the objective and its contact surface, using which the light entering through the light incidence surface 25 and passing through the objective 21 is conducted to the light exit surface 26 of the light trap. The light exit surface 26 is only slightly larger than the imager surface 7 and is opposite thereto in the embodiment shown. The light trap has a shape tapering in steps toward the light exit surface 26 for a good light yield. Other shapes of light traps having comparable reflection properties of the inner surface of the light trap may also be used. A light trap tapering in a parabola is shown as an alternative in FIG. 3. To avoid interfering light reflections, the inner surface 27 of the light trap is provided with a diffusely reflecting structure (not shown). If the light yield is sufficient for the application or for the sensor chip 1 employed or interfering reflections do not occur, or both, the image acquisition device may also be implemented without a light trap in one embodiment.

In the embodiment according to FIG. 1, the contact surface 23 is formed by the exterior surface of the lowermost step of the light trap running parallel to the top side 3 of the sensor chip 1. It encloses the entirety of the circumference of the imager surface 7 and thus avoids a lateral light incidence on the imager surface 7.

Various surfaces, which have a defined situation to the carrier 4, via which the positioning of the image acquisition device may be performed, or a defined situation to the top side 3 of the sensor chip 1, may be used as the reference surface in the embodiment. Due to the latter reference, the reference surface simultaneously has a defined position to the contact surface 23 and to the imager surface 7, which lie in a shared plane or at least in parallel planes with the top side 3 of the sensor chip 1. For this reason, the pedestal surface 6 or the top side 3 itself may be used as the reference surface. Of course, other surfaces may also be used as a reference surface, which lie parallel or at a defined angle to the contact surface 23.

The objective carrier has a depression 29 on its side facing toward the carrier 4, whose area 31 is larger than the pedestal 5, on which the sensor chip 1 is situated, and is also larger than the circuit board 13, at least in the extension, which lies parallel to the plane of the drawing in FIG. 1. The light trap projects into the depression 29. The external shape of the light trap also runs stepped like the internal shape, with spacing becoming smaller toward the sensor chip 1. Enough free space is thus provided in the area above the contact pads 9 at the outer edges of the sensor chip 1 to implement the contacting of the contact pads 9 by wire bridges as flexible connectors 11, without any contact of the wire loops to the exterior surface of the light trap. If such a contact is avoided by other measures or other contacts of the sensor chip 1 are implemented in other embodiments, another design of the exterior surface of the light trap projecting into the depression is also possible.

The objective carrier 20 is situated on the carrier 4 in such a way that the depression 29 bulges over the pedestal 5, the sensor chip 1, and a part of the circuit board 13, at a defined spacing to the circuit board 13 and pedestal 5. The depth of the depression 29 is approximately as great as the height of the pedestal 5, the sensor chip 1, and the part of the light trap projecting into the depression 29 together in the exemplary embodiment according to FIG. 1. In this way, the exterior wall 33 of the objective carrier 20 surrounding the depression 29 is supported on the carrier 4. If a joint remains, it may be closed using a caulking material as described below, which has those mechanical, chemical, or optical properties required by applications of the image acquisition device its environmental conditions.

The exterior wall 33 of the objective carrier 20 is correspondingly omitted in the area of the objective carrier 20 into which the circuit board 13 projects out of the objective carrier 20 (not shown), so that the attachment of the exterior wall 33 of the objective carrier to the circuit board 13 is also produced there by a contact or by a joint.

The setting of the precise lateral position of the objective carrier 20 and thus the contact surface to the sensor chip 1 and also its angular orientation, in relation to the rotational axis in the direction of the optical axis of the device, are possible by suitable adjustment means (not shown), which may be situated on the objective carrier 20 and corresponding thereto on the carrier 4 or alternatively or additionally on the sensor chip 1. It is also possible through the number, situation, and design of such adjustment means to define a unique assignment of a specific objective carrier 20 to an image recording device of a specific camera and to its exact position, so that its installation is also possible in an at least partially automated way.

In the exemplary embodiment shown in FIG. 1, the objective carrier 20 is fixed on the carrier 4 by suitable retention means 35, such as clamps, screws, or similar means, for example. With the aid of the retention means 35, the objective carrier 20 is drawn in the direction of the carrier 4 and simultaneously of the contact surface 23. By setting the height of the depression 29 in relation to the overall height of the above-mentioned components in the depression 29, a defined force at which the contact surface 23 is pressed onto the sensor chip 1 is set. To compensate for height tolerances or thermal or mechanical strains, a yielding layer 36 may be situated between the exterior wall 33 and the carrier 4 as caulking material 36, which limits the contact pressure between contact surface 23 and sensor chip 1 to a defined amount. Such a yielding layer 36 may be implemented by an adhesive or another suitable material.

Alternatively to the described objective carrier 20, which forms a cavity around the sensor chip 1, the objective carrier may also only rest on the sensor chip 1 if a corresponding chip housing or carrier substrate of the sensor chip 1 allows such an installation, for example. The support of the objective carrier 20 using individual supports on the carrier 4 or the circuit board 13 or both is also possible.

Figure 3:
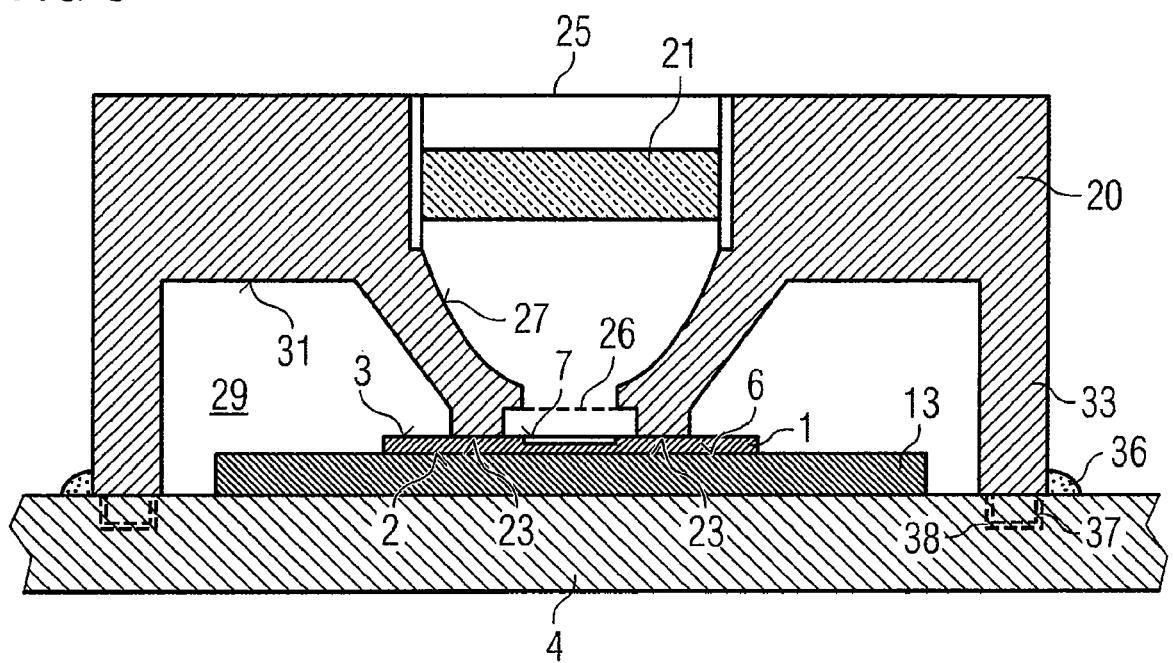
FIG. 3 shows a further embodiment of an image-recording device, which is installed using a circuit board on a carrier, in a sectional illustration.

FIG. 3 represents a further embodiment of an image acquisition device. In this embodiment, the sensor chip 1 is mounted on a circuit board 13 and on a carrier 4 using the circuit board 13. This design may be applied for various connection technologies between sensor chip 1 and circuit board 13, for example, for which no flexible connectors 11 are to be used. In addition, various pre-fabrications of this connection may also be implemented. According to FIG. 3, the circuit board 13 is installed on a plate-shaped carrier 4, which does not have a pedestal. In this embodiment, for example, the top side 3 of the sensor chip 1 or the top side of the circuit board 12 lying parallel thereto may be suitable as the reference surface.

In addition to the deviating construction of sensor chip 1 and circuit board 13 on the carrier 4, the embodiment according to FIG. 3 differs from that in FIG. 1 by the shape of the light trap, which is integrated in the objective carrier. Its internal surface has a parabola shape dropping toward the imager surface 7 and ends at a spacing above the sensor chip 1. The contact surface 23 is formed here by the area of three or more bases on the base of the light trap, which also set the spacing of the light trap to the imager surface 7. The contact surface 23 may, alternatively to the shape shown, also be formed by three or more nearly punctual surfaces, because a three-point mounting is known to be a very stable mounting. Alternatively, such a configuration of the objective carrier 20 on bases or similar elements may also be performed with an objective carrier 20 without a light trap.

The connection of the objective carrier 20 to the carrier 4 is also performed here via the exterior wall 33 of the objective carrier 20, which is supported on the carrier 4 adjacent to the circuit board 13. For the lateral and angular orientation of the objective carrier 20, the objective carrier has multiple guide pins 37 distributed on its bottom side in the illustrated embodiment, which engage in corresponding openings 38 in the carrier 4 and may be glued therein.

A joint between the exterior wall 33 and the carrier 4 or the circuit board 13 is closed using yielding caulking material 36, so that the cavity, which also exists around the sensor chip 1 here, is implemented to be optically tight because of the optically tight materials of the objective carrier 20 and the caulking material 36. The only possible incident radiation occurs through the objective 21 positioned above the sensor chip 1. The optical tightness extends not only to visible light, but also may relate to all of the wavelength ranges, which may be used for capturing the surroundings in the particular application. If the optical seal is not necessary or is implemented by other components of the camera, instead of the peripheral exterior wall 33 of the objective carrier 20, other components may also be used for installing the objective carrier 20 on the carrier 4 or alternatively on the circuit board 13, such as supports or clamps or similar components, for example.

The use of yielding caulking material 36, which may simultaneously fix the object carrier 20 on the carrier 4 as an adhesive, defines the force at which the contact surface 23 is pressed on the sensor chip. To set the force via the heights of the components of the image acquisition device connected to one another, reference is made to the above embodiments. In addition to the fixing, such a joint using yielding caulking material 36 allows the equalization of thermally related tensions between the usually different materials of the carrier 4 and objective carrier 20.

The invention claimed is:

1. An image acquisition device of a camera having an electronic sensor chip, said chip having an optically active imager surface, and being electrically connected to a circuit board, said device including an objective situated in an objective carrier and having a situation and inclination oriented in relation to the imager surface, wherein the situation and inclination of the objective are defined by a contact surface of the objective carrier, and said contact surface of the objective carrier lies flat on the sensor chip, so that the imager surface is not covered by the contact surface and wherein the objective carrier comprises a tubular light trap, having a light incidence surface enlarged in comparison to the imager surface, an internal cross-section which becomes smaller toward the imager surface, and a diffusely reflecting tube inner surface, a smaller of two areas of the tube of the light trap forming the contact surface.

2. Image acquisition device according to claim 1, wherein the contact surface completely encloses the imager surface.

3. Image acquisition device according to claim 1, wherein the contact surface rests on the sensor chip between the imager surface and contact pads of the sensor chip, and the contact pads are situated on a top side of the sensor chip for electrical contacting of the sensor chip.

4. Image acquisition device according to claim 1, wherein the sensor chip is installed directly on a carrier and electrical connection between the sensor chip and the circuit board is produced using flexible connectors.

5. Image acquisition device according to claim 4, wherein an external contour of the light trap has a stepped construction having an increasing external cross-section with increasing distance to the sensor chip.

6. Image acquisition device according to claim 1, wherein the sensor chip is installed on a circuit board and on a carrier using the circuit board.

7. Image acquisition device according to claim 6, wherein the objective carrier includes retention means for fastening the objective carrier on the circuit board in such a way that the contact surface is pressed on the sensor chip at a defined force.

8. Image acquisition device according to claim 1, wherein the objective carrier includes retention means for fastening the objective carrier on a carrier for the sensor chip in such a way that the contact surface is pressed onto the sensor chip at a defined force.

9. Image acquisition device according to claim 1, wherein the objective carrier has a yielding layer.

* * * * *